United States Patent [19]

Cutting et al.

[11] Patent Number: 5,969,945
[45] Date of Patent: *Oct. 19, 1999

[54] ELECTRONIC PACKAGE ASSEMBLY

[75] Inventors: Lawrence R. Cutting, Owego; Michael A. Gaynes, Vestal; Eric A. Johnson, Greene; Cynthia S. Milkovich, Vestal; Jeffrey S. Perkins, Endwell; Mark V. Pierson, Binghamton; Steven E. Poetzinger, Endicott, all of N.Y.; Jerzy Zalesinski, Essex Junction, Vt.

[73] Assignee: International Business Machines Corporation, Armonk, N.Y.

[ * ] Notice: This patent is subject to a terminal disclaimer.

[21] Appl. No.: 08/808,829

[22] Filed: Feb. 27, 1997

Related U.S. Application Data

[62] Division of application No. 08/071,630, Jun. 3, 1993.

[51] Int. Cl.⁶ ............................................. H05K 7/20
[52] U.S. Cl. ...................... 361/704; 174/252; 174/254; 361/707; 361/720; 361/749
[58] Field of Search .................... 174/252, 254; 361/704, 707, 713, 719–721, 749

[56] References Cited

U.S. PATENT DOCUMENTS

| | | |
|---|---|---|
| 3,781,596 | 12/1973 | GAlli et al. .............................. 317/701 |
| 3,868,724 | 2/1975 | Perrino ....................................... 357/65 |
| 4,149,219 | 4/1979 | Kraft . |
| 4,460,224 | 7/1984 | Stopper . |
| 4,567,543 | 1/1986 | Miniet . |
| 4,645,732 | 2/1987 | Young . |
| 4,677,528 | 6/1987 | Miniet . |
| 4,682,269 | 7/1987 | Pitasi . |
| 4,682,270 | 7/1987 | Whitehead et al. . |
| 4,761,881 | 8/1988 | Bora et al. ................................ 29/840 |
| 4,811,165 | 3/1989 | Currier et al. . |
| 4,834,660 | 5/1989 | Cotti ......................................... 439/67 |
| 4,858,073 | 8/1989 | Gregory . |
| 4,928,206 | 5/1990 | Porter et al. . |
| 4,945,029 | 7/1990 | Bronnenberg . |
| 4,998,342 | 3/1991 | Bonnell et al. ............................ 29/840 |
| 5,112,694 | 5/1992 | Konotsune et al. . |
| 5,121,297 | 6/1992 | Haas ......................................... 361/398 |
| 5,144,742 | 9/1992 | Lucas et al. ............................... 29/830 |
| 5,159,751 | 11/1992 | Cottingham et al. . |
| 5,168,430 | 12/1992 | Nitsch et al. ............................. 361/398 |
| 5,179,501 | 1/1993 | Ocken et al. ............................. 361/388 |
| 5,218,516 | 6/1993 | Collins et al. ............................ 361/721 |
| 5,219,640 | 6/1993 | Gazit et al. ............................... 428/209 |
| 5,224,023 | 6/1993 | Smith et al. . |
| 5,228,192 | 7/1993 | Salatino . |
| 5,261,593 | 11/1993 | Casson et al. . |
| 5,288,542 | 2/1994 | Cibulsky et al. ......................... 428/209 |
| 5,288,950 | 2/1994 | Ushio et al. . |
| 5,345,205 | 9/1994 | Kornrumpf ............................... 361/749 |
| 5,362,656 | 11/1994 | McMahon ................................ 361/749 |
| 5,378,306 | 1/1995 | Cibulsky et al. ......................... 156/630 |
| 5,450,286 | 9/1995 | Jaques et al. . |
| 5,452,182 | 9/1995 | Eichelberger et al. .................. 361/749 |

FOREIGN PATENT DOCUMENTS

| | | |
|---|---|---|
| 0369919 | 5/1990 | European Pat. Off. . |
| 2480488 | 10/1981 | France . |

OTHER PUBLICATIONS

IBM Tech. Disc. Bulletin vol. 25 No. 7B Dec. 82 "Integral Heatsink Printed Circuit Card".
IBM Tech. Disc. Bulletin vol. 21 No. 9 Feb. 79 Multifunction Plug for IC Package.
IBM Tech. Disc. Bulletin vol. 26 No. 12 May 84' Multilayer Flexible Film Module.
IBM Tech. Disc. Bulletin vol. 30 No. 3 Aug. 87' "Concept for Forming Multilayer Structures for Electronic Packaging".
IBM Tech. Disc. Bulletin vol. 32 No. 4A Sep. 89' "Removal of Heat from Direct Chip Attach Circuitry".

*Primary Examiner*—Gregory Thompson
*Attorney, Agent, or Firm*—John R. Pivnichny

[57] ABSTRACT

A screen printing fixture holds a flexible circuit board having components attached to one side, to allow screening a pattern of solder paste onto the second side for subsequent attachment of components to that side. In an electronic package assembly a flexible circuit board with components is wound about a heat spreader assembly having a cavity so that at least one component on the flexible circuit board is positioned within the cavity and in thermal connection to the heat spreader.

4 Claims, 6 Drawing Sheets

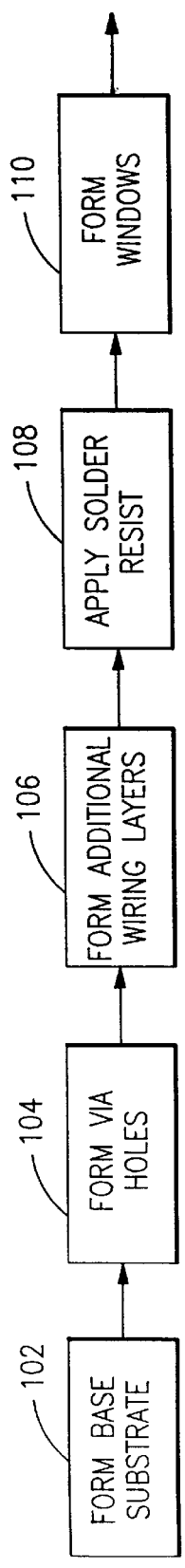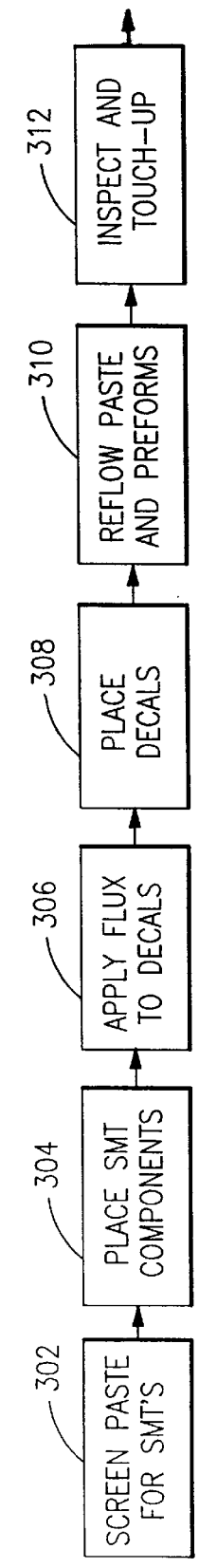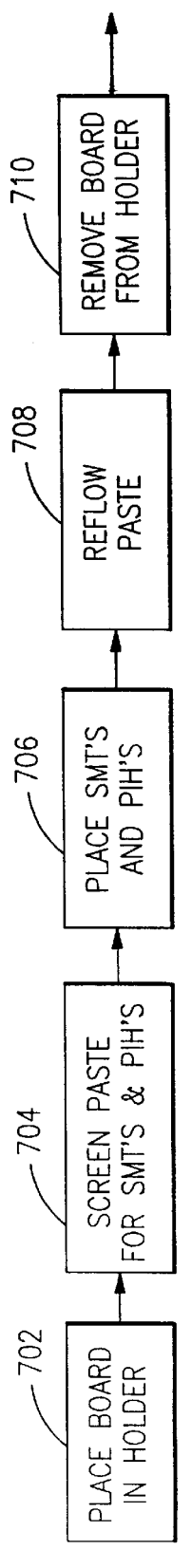

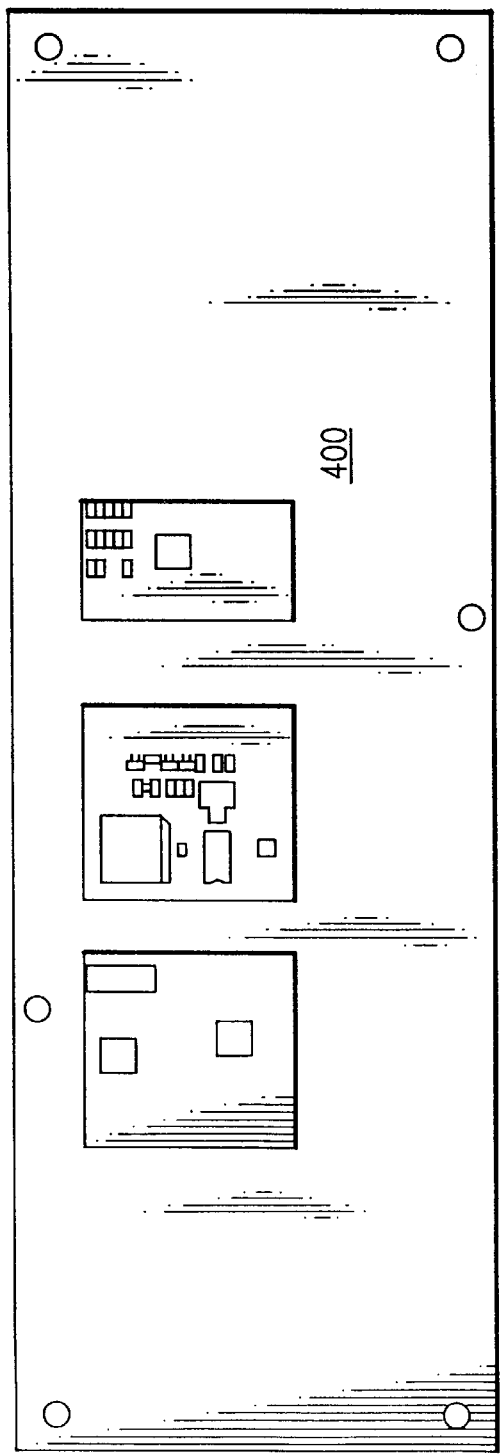
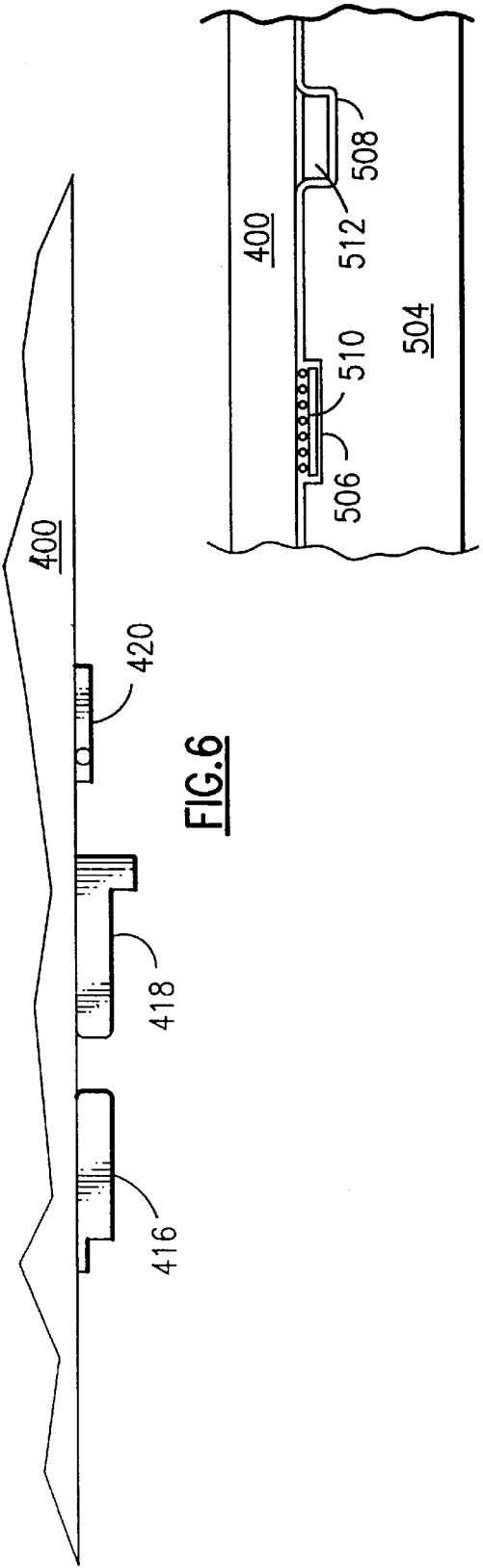

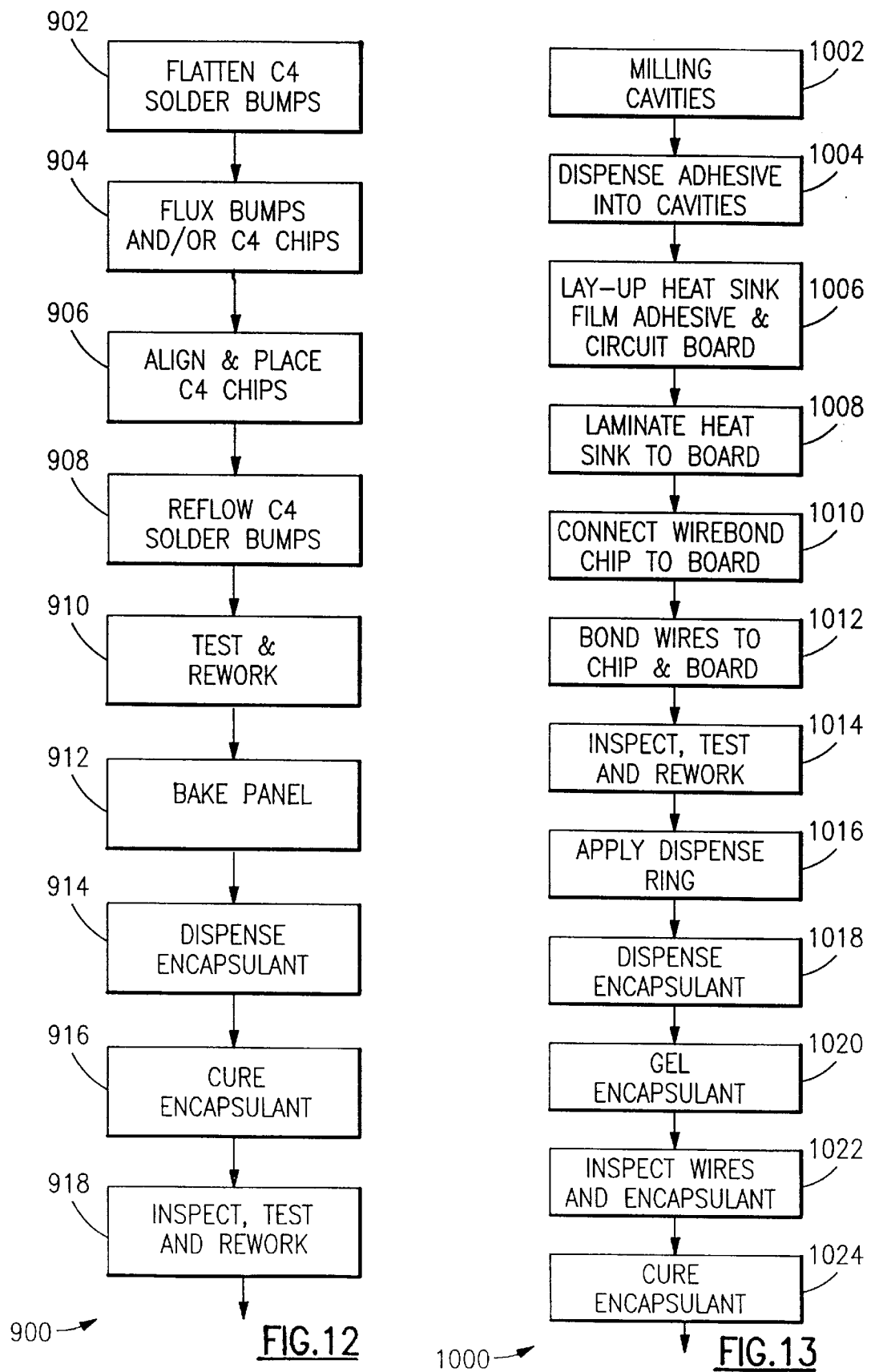

ELECTRONIC PACKAGE ASSEMBLY

This is a divisional of copending application Ser. No. 08/071,630 filed on Jun. 3, 1993.

FIELD OF INVENTION

The present invention relates to multi-layer substrates for flexible circuit boards and flexible circuit board assemblies and their methods of manufacture. More particularly this invention relates to a multi-layer flexible circuit board substrate for attaching components including chips and heat spreaders to form a three-dimensional circuit board assembly.

BACKGROUND

All levels of packaging, (chip, electronic circuit assembly and systems) are becoming more miniaturized. A major technical challenge is thermal dissipation as power density increases. Typically, heat spreaders or heat sinks are bonded to microelectronic components and chips, individually. Occasionally, a common heat sink may be bonded to multiple chips on co-planer top surfaces. In many applications, space limitations and cost do not allow the use of heat sinks or co-planer electronic assemblies.

Flexible circuit boards offer advantages of light weight, thinness, three dimensional configuration, and flexibility. Space and height constraints for circuit packaging may dictate the use of flexible circuits over rigid laminates and very low profile chips and packages over high profile chip modules.

U.S. Pat. No. 3,781,596 discloses a single layer interconnection structure of metallic conductors on a polyimide film (e.g. KAPTON™ by E. I. DuPont De Nemours & Co.). U.S. Pat. No. 3,868,724 discloses metallic conductors sandwiched between polyimide film which project through the film.

Rigid-Flex circuit boards are described in U.S. Pat. No. 5,121,297 to Haas and U.S. Pat. No. 5,144,742 to Lucas. In those patents single layer flex circuit boards are integrally connected between rigid circuit boards. In both patents multiple rigid circuit board layers are laminated to a flexible circuit board substrate and components are attached only onto the rigid circuit board sections.

Connecting components directly to one side of a single-layer flexible circuit board is described by McBride, "Multifunction Plug for IC Package", IBM Technical Disclosure Bulletin Vol. 21, February 1979, pp. 3594–3595. I/O terminals on the bottom of a chip are soldered to pads on top of a thin polyimide flexible decal. Also, a depression in a heat sink cover is bonded onto the top of the chip. Connecting lower power chips to a bottom side of a multi-layer flexible circuit board and high power chips to the top side of the flexible circuit board in order to connect the high power chips to the module cap is suggested by McBride, "Multilayer Flexible Film Module", IBM Technical Disclosure Bulletin Vol. 26, May 1984, p. 6637. In that article I/O pins connect the flexible film to a metalized ceramic substrate, and smaller pins interconnect the layers of the film. Schrottke, "Removal of Heat from Direct Chip Attach Circuitry", IBM Technical Disclosure Bulletin Vol. 32, September 1989, pp. 346–348 describes a flexible circuit board with two rows of Direct Chip Attach (DCA) chips attached by controlled collapse chip connections (C4). The flexible circuit board is folded around a stiff heat spreader of copper-INVAR-copper (INVAR is a trademark of Creusot-Loire for a nickel-iron alloy) with the chips on the inside of the fold. The exposed surfaces of each row of chips are bonded with a thermally conductive adhesive to a respective major surface of the spreader.

U.S. Pat. No. 5,179,501 to Ocken, and U.S. Pat. No. 5,159,751 to Cottingham disclose bonding flexible circuit boards directly to one side of an aluminum plate. In Ocken, heat is conducted through the circuit board to a first heat sink plate then to a second heat sink plate bonded to the first plate. "Concept for Forming Multilayer Structures for Electronic Packaging" (Curtis), IBM Technical Disclosure Bulletin Vol. 30, August 1987, pp. 1353–1356 and U.S. Pat. No. 4,811,165 to Currier, disclose folding a flexible circuit board around a heat sink plate and bonding the board to both sides of the plate. In both citations, before bonding the board to the plate, components are connected to the side of the board which is not connected to the plate. "Integral Heatsink Printed Circuit Board" (Askalv), IBM Technical Disclosure Bulletin Vol. 25, December 1982 p. 3606, discloses a flexible circuit board adhesively bonded to a heat sink of steel or aluminum.

U.S. Pat. No. 5,168,430, discloses a portion of a flexible circuit board applied to a heat sink plate and provided with a cutout in which a hybrid circuit structure is cemented to the plate. The hybrid circuit structure is wirebonded to the flexible circuit board.

U.S. Pat. No. 4,834,660 to Cottiat, FIG. 9, shows a circuit board interconnection system in which layers of a flexible circuit board are removed in part of a bend to expose a selected wiring layer for connection. The flexible circuit board is of copper clad polyimide.

All the above citations are hereby incorporated by reference.

OBJECTS OF THE INVENTION

A general object of the invention is to provide an improved flexible circuit board substrate.

Another object of the invention is to provide enhanced thermal operation of flexible circuit boards with components mounted to both sides.

Another object of the invention is to provide a method and apparatus to produce a flexible circuit board with components mounted on screened paste on both sides of the circuit board. Components include wire bond, flip chips, SM (surface mount) active discrete components, and PIH (pin-in-hole).

A further object of the invention is to provide an improved heat sink structure for flexible circuit boards.

BRIEF DESCRIPTION OF THE DRAWINGS

FIG. 1 is a process flow diagram of a specific embodiment of the process for forming a circuit board substrate of the invention;

FIG. 4 is a process flow diagram of a specific embodiment of the initial process for mounting components to the front side of the substrate of the invention to form a circuit board of the invention;

FIG. 5 is plan view of a specific embodiment of the back side of the circuit board of the invention;

FIG. 6 is an elevation of the circuit board of FIG. 5 showing the heat sinks on the front side;

FIG. 10 is a partial cross section of a part of the back plate of the fixture of FIG. 9 through section lines 10—10 showing the cavities conforming to components mounted on the front side of the circuit board;

FIG. 11 is a process flow diagram of a specific embodiment of the process for mounting components onto the back side of the circuit board of the invention;

FIG. 12 is a process flow diagram of the process for mounting flip chips to solder bumps on the front side of the circuit board of the invention;

FIG. 13 is a process flow diagram for a specific embodiment of the method of bonding the circuit board, flip and wirebond chips to the heat sink plate and encapsulating the wirebond chips in the invention;

ENABLING DESCRIPTION OF PREFERRED EMBODIMENTS

Figure 2:
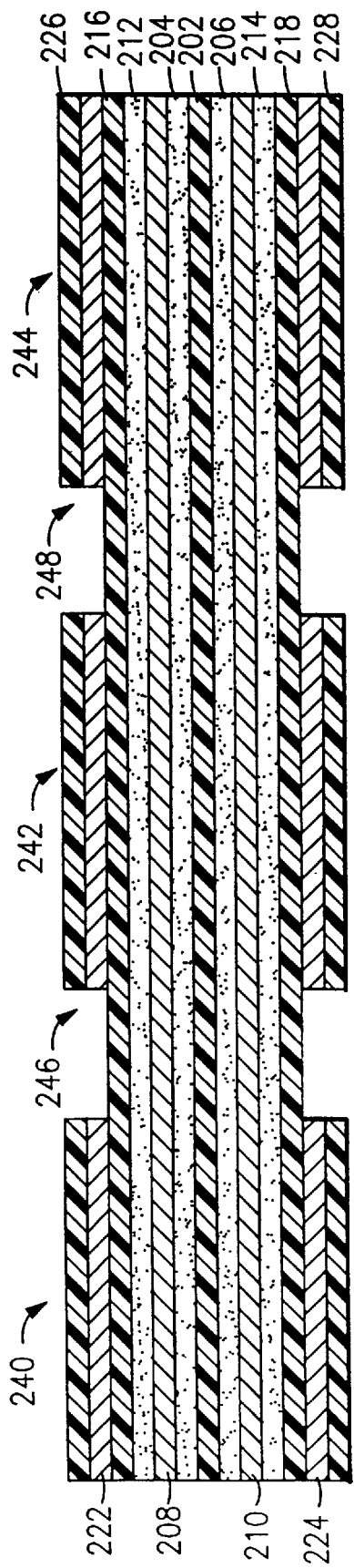
FIG. 2 is a schematic cross section of a specific embodiment of the circuit board substrate of the invention showing the layers of the thicker, stiffer areas and thinner, more flexible areas.
Figure 3:
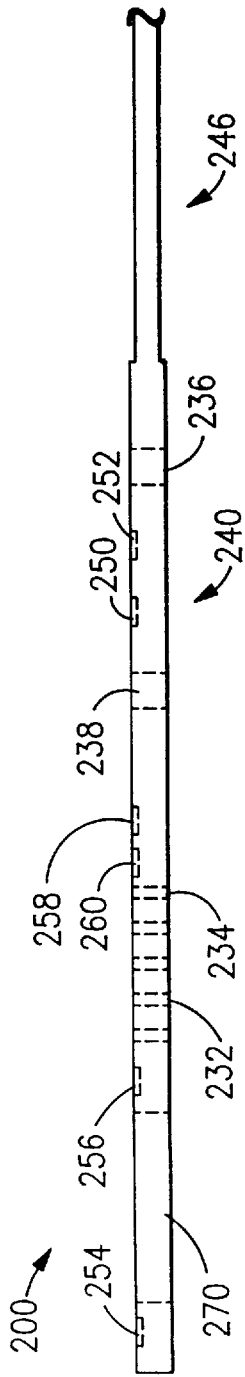
FIG. 3 is a side elevational view of a part of the embodiment of FIG. 2 showing the plated through holes and windows in the stiffer areas.

FIG. 1 illustrates a specific example of the process 100 for producing the circuit board structure of the invention and FIGS. 2 and 3 schematically illustrate an example structure of the circuit board substrate 200 of the invention with thickness exaggerated for clarity. In step 102 of FIG. 1, the base substrate may be formed (see FIG. 2) by covering both major surfaces of a dielectric film 202 with a respective layer of adhesive 204, 206. Preferably, the dielectric layers of the base substrate are dry polyimide film such as KAPTON by DuPont and the adhesive layers are a dry epoxy film and both the dry polyimide film and film adhesive used in this process are about 0.025 mm thick. Then the exterior surface of each film adhesive layer is covered with a patterned metal layer 208, 210 resulting in a two layer circuit board. Preferably, the metal layers are copper foil which are previously etched to form a circuit pattern and are about 0.018 mm thick and include a chromium layer deposited on both major surfaces of the copper foil to avoid oxidizing the copper and to promote adhesion. Then the exterior surface of each patterned copper foil is covered with another layer of adhesive 212, 214 and then another layer of dielectric 216, 218 as described above. Then the entire structure is laminated under heat and pressure. Other processes for making such a two layered flexible circuit board base with external dielectic coverings are well known in the art.

In step 104, via holes 232, 234 are formed through the circuit board by, for example punching or drilling, and are preferably 0.01–0.04 mm across, and more preferably about 0.025 mm across. Additional holes 236, 238 may be similarly formed through the circuit board for other purposes such as attaching pin-in-hole (PIH) components and connectors and the diameters of such additional holes will depend upon their use.

In step 106, deposited metal wiring layers 222, 224 are formed. Metal is deposited in the through holes 232, 234, 236, 238 and on the exterior surfaces of the outer dielectric layers 216, 218. Preferably, the metal is electroplated or electrolessly plated and about 0.025 mm thick on the surface using a photo-chemical additive or more preferably a subtractive photo-chemical process to pattern the copper. In step 108, each deposited copper pattern is covered with an additional dielectric layer 226, 228 such as a solder resist. Preferably the solder resist is Taiyo (PSR 4000).

The holes, additional deposited copper layers, and additional dielectric layers of steps 102 through 104 are provided only at selected parts of the exterior of the circuit board to define thicker, stiffer areas 240, 242, 244 where additional wiring and dielectric layers extend, and to define more flexible, thinner areas 246, 248 through which the circuit board can be bent about a line without bending the stiffer areas. The additional wiring patterns may include connection pads 250, 252 for leaded surface mount technology (SMT) components, wirebond pads 254, 256 for wirebond chips, and arrays of pads 258, 260 for soldered flip chip interconnection. Pads may include vias such as 232, 234 as shown in FIG. 3.

In step 110, rectangular windows 270 shown in FIG. 3, may be punched, drilled, or otherwise formed by known processes through the circuit board for any wirebond chips which need to be bonded to a heat sink attached to the circuit board. The windows will typically be surrounded by rows of wirebond connection pads 254, 256 forming a rectangle around the windows.

The description of the formation of the substrate is complete and components need to be added to form a circuit board.

FIG. 4 illustrates a specific embodiment of the process 300 of the invention for attaching components to the front of the substrate for producing a specific circuit board embodiment 400 of the invention illustrated in FIGS. 5 through 8.

Figure 7:
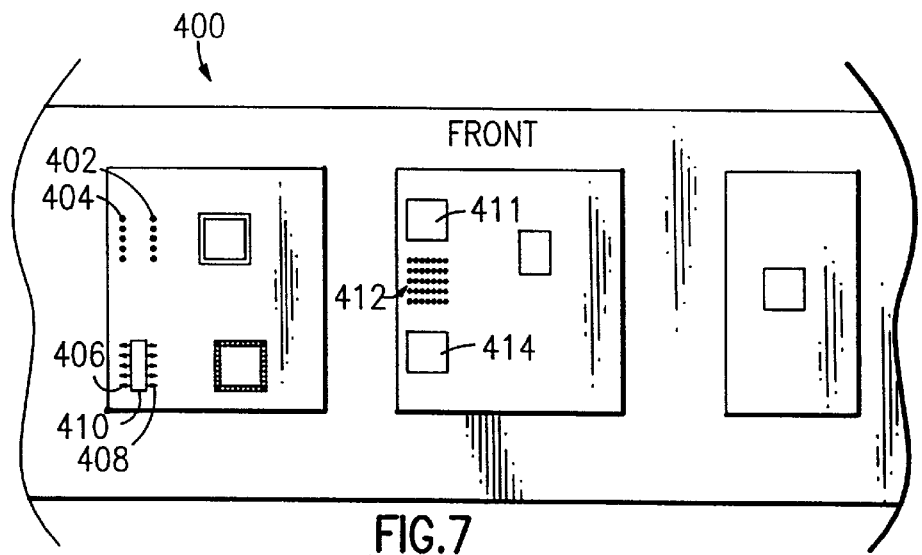
FIG. 7 is a plan view of a section of the front of the circuit board of FIG. 5 with the heat sink plates removed and with some other components also removed for illustration.

In step 302, solder paste may be screened through a mask onto pads 402, 404, 406, 408 for attaching leads of Surface Mount Technology (SMT) components on a front side of the circuit board as best seen in FIG. 7. Preferably, a water clean paste is utilized such as ALPHA 1208 (of Alpha Metals) and more preferably a no-clean paste such as ALPHA LR701 or even more preferably KESTER R-244. Then in step 304, SMT components 410 are positioned with leads on the paste on the SMT pads on the front side of the circuit board. If area array direct chip attachment is required, solder may need to be applied to pad arrays. One method of applying such solder is by transferring from solder preform decals by reflow. Flux is applied to solder preform decals 411 in step 306 and is preferably a no-clean flux. The preform decals are aligned and placed onto flip chip pad arrays 412 on the front side of the circuit board in step 308. Alternatively, solder may be applied to the board chemically, or electrically, or by wave solder; or eutectic solder may be applied to the high temperature solder balls on the flip chip.

In step 310, the circuit board is heated sufficiently to reflow the paste to solder the SMT components to the SMT pads and transfer the solder of the preforms from the decals to the pad arrays to form solder bumps. Preferably, reflow is by infrared heating in an oven with an N2 atmosphere and preferably the heating profile consists of a ramp up of about 1.8 degrees C./sec, Dwell at about 150 to 160 degrees C. for about 200 to 250 seconds and at about 180 degrees for about 90 to 145 seconds. Finally in step 312, after any solder decals are removed from the circuit board, the SMT connections and flip chip site solder bumps are visually inspected preferably with a microscope and touched up by adding any additional solder volumes required and locally reflowing the added solder as needed. The solder is preferably added by manually applying solder preforms to the pads or connections. If water clean pastes or fluxes have been applied, then the circuit board should be cleaned with de-ionized water.

Figure 9:
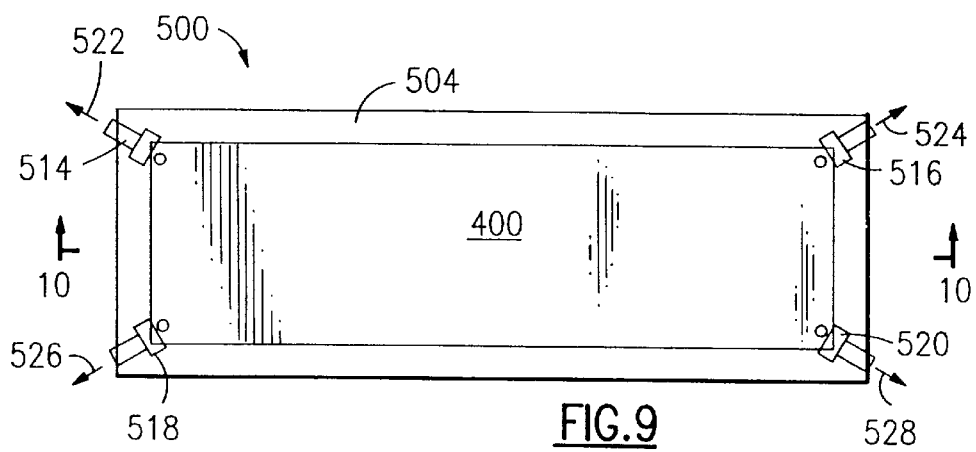
FIG. 9 is a schematic plan view of a specific embodiment of the fixture of the invention for holding the circuit board front side down for screening paste on the back side.

FIGS. 9 and 10 illustrate the fixture 500 for holding the flexible circuit board 400.

Figure 8:
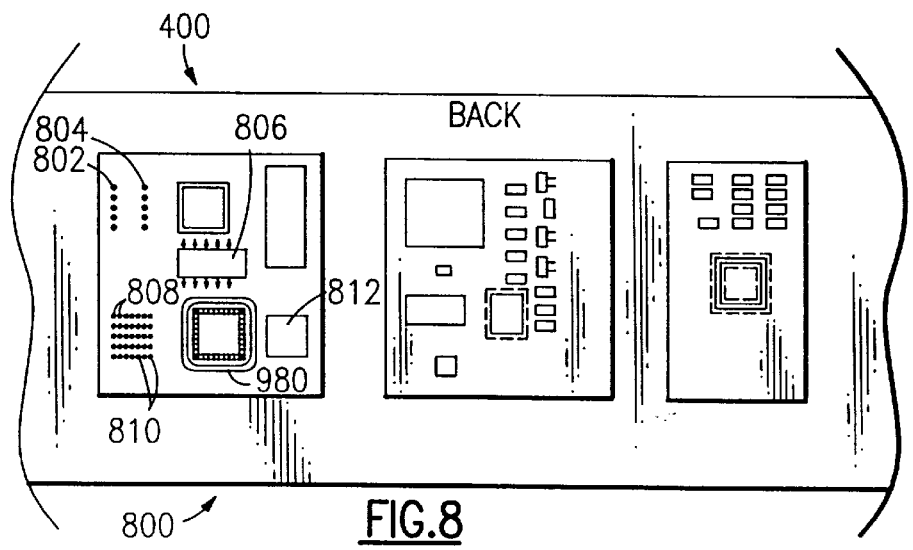
FIG. 8 is a plan view of the back side of the same section of the circuit board as in FIG. 7 with some components removed for illustration.

FIG. 11 illustrates a specific embodiment of the process 700 of the invention for attaching components to the back of the substrate to produce a specific circuit board embodiment 800 of the invention illustrated in FIG. 8.

In step 702, circuit board 400 is placed in a holding fixture 500 with the front side of the circuit board facing down onto back plate 504 with cavities 506, 508 conforming to components 510, 512 mounted on the front side of the circuit board. Stretching clamps 514 through 520 pull the corners of the board with approximately equal force in approximately diagonal directions as represented by equal sized arrows 522 through 528.

In step 704, solder paste is screened through another mask onto pads 802, 804 for attaching Surface Mount Technology (SMT) component 806 and screened onto plated through holes 808, 810 for attaching pin-in-hole (PIH) components 812 on a back side of the circuit board (See FIG. 8). Again no-clean solder pastes described above are preferred. Components 806, 812 are placed on the paste on the pads on the back side of the circuit board in step 706. In step 708, the circuit board is heated for a second reflow for soldering the SMT and PIH components to the back side of the circuit board. Preferably, the reflow temperature profile is similar to the profile for the first circuit board reflow and again infrared heating is preferred. Finally the circuit board is removed from fixture 500 in step 710. Alternately, the circuit board may be removed from the fixture any time after screening. If only PIH components are to be placed, then molten solder wave may be substituted for the above screening and reflowing procedure.

FIG. 12 illustrates the process 900 for attaching and encapsulating flip chips 414 on the front of circuit board 400 as shown in FIG. 7. In step 902, the area arrays of solder bumps 412 on the front side of the circuit board are mechanically flattened, preferably using a semi-automatic pneumatic bump flattener. In step 904, flux is applied to the flip chips and/or to the arrays of solder bumps. Preferably, the flux is a no-clean flux described above. The flip chips are aligned and placed on the flattened solder bump area arrays on the front side of the circuit board in step 906.

In step 908, the circuit board receives a third reflow heating cycle preferably in a reflow oven for flip chip connection to the front side of the circuit board. Preferably, the reflow temperature profile melts the eutectic solder connection between the high temperature solder ball and the chip pad in order to let the solder ball float to a position intermediate between the chip pad and circuit board pad or via to minimize stresses.

In step 910, the circuit board is tested and chips are reworked as required to meet electrical specifications. If required, the circuit board is baked in step 912 to drive off any water or other solvents. Preferably, the board is baked at about 112 degrees centigrade for about 2 hours. In step 914, liquid plastic encapsulant, preferably HYSOL FP4511, is dispensed to fill the space under the flip chips. Preferably, any SMT and PIH components are also encapsulated. Then the encapsulant is cured in step 916, preferably in an oven and at about 130 degrees centigrade and for about 5 hours. Finally in step 918, the encapsulant is inspected, and the chips electrically tested, and any required rework of the chips is completed.

Figure 14:
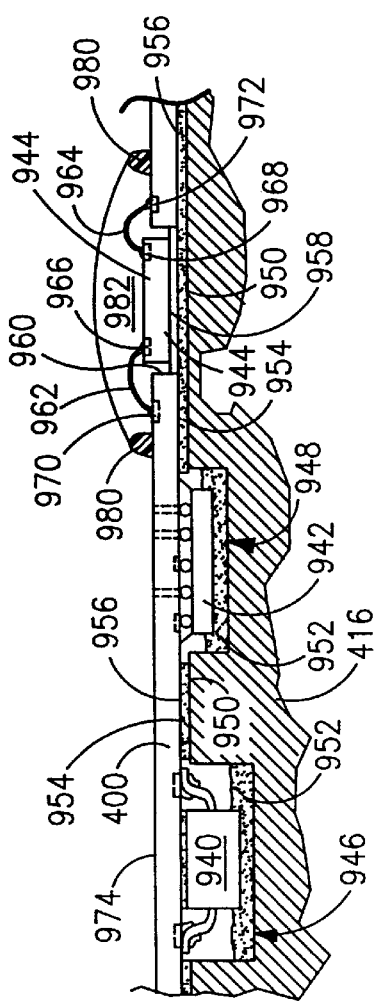
FIG. 14 is a side elevational view, partly in cross section showing part of the connections between the heat sink, flexible circuit board, flip chips, wirebond chips and SMT (surface mount technology) chips connected to the circuit board in a specific embodiment of the invention.

FIG. 13 illustrates the process 1000 for manufacturing and attaching heat sink plates 416, 418, 420 to the circuit board, as shown in FIG. 6, and for mounting and encapsulating wirebond chips 980, as shown in FIG. 8. FIG. 14 schematically illustrates a cross section of some of the connections between the heat sink 416, flexible circuit board 400, SMT module 940, flip chip 942, and wirebond chip 944. In step 1002, cavities 946, 948 are milled in a first surface 950 of heat sink plate 416 to conform to chips mounted on the front of the circuit board when the heat sink plate is mounted on the front surface of the circuit board, as shown in FIG. 14. A measured amount of a thermally conductive paste 952 such as thermal grease or preferably, thermally conductive adhesive, such as a thermoset or thermoplastic precursor filled with metal particles, is dispensed into the heat sink cavities or onto the chips that fit into the conforming cavities, in step 1004.

In lay-up step 1006, heat sink surface 950 is covered with adhesive 954, and the front side 956 of circuit board 400 is positioned on the adhesive on the heat sink with heat and pressure. Preferably, the adhesive is a film adhesive, more preferably Rogers 8970, and preferably, the heat is at about 165–185 degrees C. and the pressure is about 100 psi, and is applied for about one second to form a connected structure. The circuit board is laminated to the heat sink with heat and pressure in step 1008. Preferably, the lamination heat is at about 130–140 degrees C. for about 1 hour and at about 170–180 degrees C. for 1 hour. A film adhesive 958 is placed on the adhesive layer 954 or more preferably adhesive layer 954 does not extend into the area of the window 960 formed through the circuit board so that the film adhesive 958 is placed directly on heat sink surface 950 at the window 960 and wirebond chip 944 is bonded in the window in step 1010. Preferably, the film adhesive used to bond the chip to the heat sink is STAYSTICK film. Bond wires 962, 964 are bonded to pads 966, 968 on chip 944 and pads 970, 972 on back side 974 of circuit board 400 for electrical interconnection in step 1012. Preferably, the wire is 1.0 mil thick Al—Si wire. Inspect, test and rework wirebond connections as required in step 1014. Preferably use microscopic inspection and perform a pull test on the wires and if wires pull loose to rebond the wires.

In step 1016, a ring 980, best seen in FIG. 8, is dispensed around the wirebond chip connection for encapsulating the wirebond chip, wires, and wirebond pads on the circuit board. Preferably the ring is an epoxy equal to HYSOL FP4323. In step 1018, encapsulant 982 such as epoxy, is dispensed within the ring to cover the wirebond connections. Preferably, the encapsulant is HYSOL 4510.

In step 1020, the encapsulant is gelled using heat at about 90 degrees centigrade for about 10 minutes and then at about 135 degrees centigrade for about 15 minutes. The encapsulant and wires are inspected and reworked as needed in step 1022. In step 1024, the encapsulant is cured using heat preferably in an oven at 155 degrees C. for about 4 hours.

Figure 15:
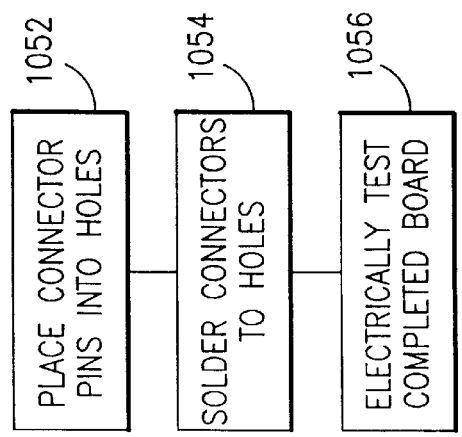
FIG. 15 is a process flow diagram for finishing up the circuit board of the invention.

FIG. 15 illustrates the process 1050 for completing the manufacture of the cirucit board. In step 1052, PIH connectors (not shown) are positioned in plated-through-holes (PTHs) in more flexible areas near the edge of the circuit board, and in step 1054, the pins are soldered in the PTH's preferably using a no-clean solder wire. Finally, in step 1056, the circuit board is extensively electrically tested, preferably using a probe tester.

Figure 16:
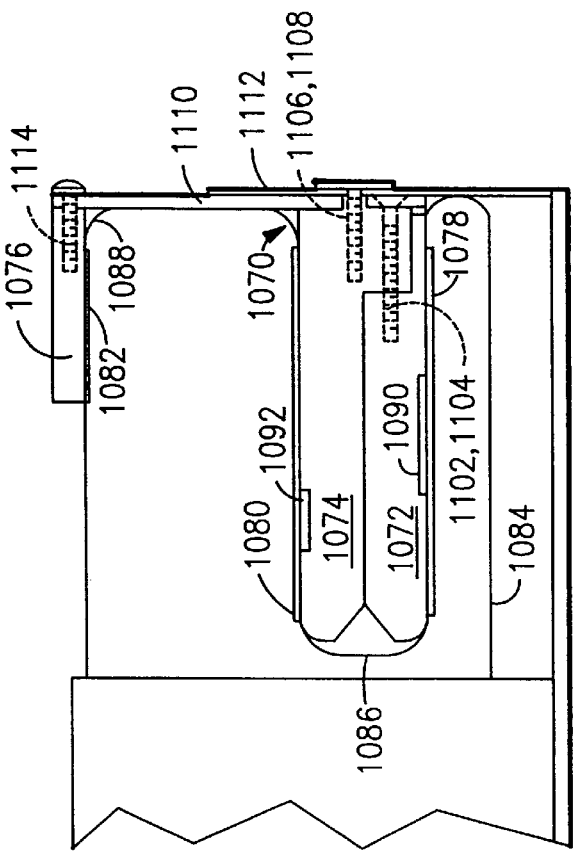
FIG. 16 is a cross section of the three heat sink plates attached to an enclosing frame and showing the attached circuit board in a specific embodiment of the invention.
Figure 17:
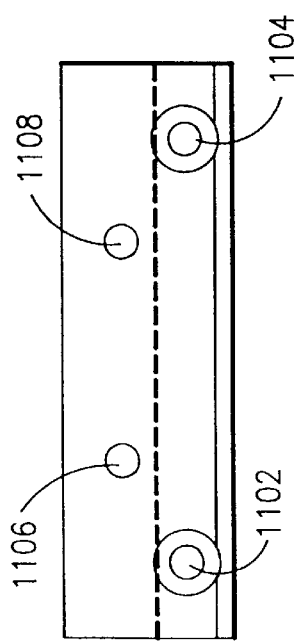
FIG. 17 is an end view of a heat sink plate in a specific embodiment of the invention.

FIG. 16 illustrates the three dimensional arrangement 1100 of the flexible circuit board 1070 and heat spreaders 1072, 1074 and 1076 in an enclosure of the preferred embodiment of the present invention. Heat spreaders 1072 and 1074 are connected together with screws 1102, 1104, best seen in FIG. 17. Screws 1106, 1108 attach the connected pair of heat spreaders 1072, 1074 to heat spreader extension 1110 and chassis or machine frame 1112 providing a thermal conduction path out of the enclosure. Screw 1114 connect heat spreader 1076 to upright heat spreader extension 1110. Other known fasteners could be substituted for the screws. In order to minimize vibration, a thermally conductive adhesive with vibration absorbing qualities may be placed between joints where heat sinks and the frame meet before connection.

Circuit board 1070 in FIG. 16 includes thicker sections 1078, 1080 and 1082 which are attached to heat sinks 1072, 1074 and 1076 respectively; and thinner sections 1084, 1086, 1088, and 1090. Section 1084, 1086 and 1088 are bent to conform to the enclosure as shown. Cavity 1090 in heat spreader 1072 is a larger cavity for multiple components (not shown) attached to thicker section 1078, and cavity 1092 is a smaller cavity for a single component (not shown) attached to thicker section 1080.

The invention of applicant has been disclosed in the form of specific preferred embodiments, however, those skilled in the art will understand that modifications can be made without departing from the spirit and scope of the invention. The invention is not limited to the preferred embodiments described herein but only by the claims that follow.

We claim:

1. An electronic package assembly, comprising:

at least one heat spreader assembly including a first surface having a cavity therein and a second surface having a cavity therein, wherein said first and second surfaces of said heat spreader assembly are located on opposite sides of said heat spreader assembly; and a flexible circuit board including first and second thick portions and at least one thin flexible portion interconnecting said first and second thick portions, and including at least two electronic components thereon with at least one of said two electronic components and said second electronic component positioned on said first and second thick portions respectively, said flexible circuit board substantially wound about said at least one heat spreader assembly such that one component on said flexible circuit board is positioned within said cavity in said first surface of said heat spreader assembly in thermal connection to said heat spreader assembly and another component is positioned within said cavity in said second surface of said heat spreader assembly.

2. The electronic package assembly of claim 1, further comprising a third electronic component positioned on said thin flexible portion of said flexible circuit board.

3. The electronic package assembly of claim 2 wherein at least part of said thin flexible portion of said flexible circuit board is laminated to said heat spreader assembly with a film adhesive.

4. The electronic package assembly of claim 3 wherein said third electronic component is positioned over said heat spreader assembly.

* * * * *